United States Patent

Haeberlen

(10) Patent No.: US 9,054,182 B2
(45) Date of Patent: Jun. 9, 2015

(54) SEMICONDUCTOR DEVICE WITH FIELD ELECTRODE AND METHOD

(71) Applicant: Infineon Technologies Austria AG, Villach (AT)

(72) Inventor: Oliver Haeberlen, Villach (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/068,583

(22) Filed: Oct. 31, 2013

(65) Prior Publication Data

US 2014/0054697 A1 Feb. 27, 2014

Related U.S. Application Data

(62) Division of application No. 12/143,450, filed on Jun. 20, 2008, now Pat. No. 8,581,342.

(51) Int. Cl.
| | |
|---|---|
| H01L 21/3205 | (2006.01) |
| H01L 29/78 | (2006.01) |
| H01L 21/8234 | (2006.01) |
| H01L 27/088 | (2006.01) |
| H01L 21/283 | (2006.01) |
| H01L 29/40 | (2006.01) |

(52) U.S. Cl.
CPC .... *H01L 29/7825* (2013.01); *H01L 21/823437* (2013.01); *H01L 21/823487* (2013.01); *H01L 27/088* (2013.01); *H01L 21/283* (2013.01); *H01L 29/407* (2013.01)

(58) Field of Classification Search
USPC .......... 438/430, 589; 257/341, E29.001, 257/E21.54
See application file for complete search history.

(56) References Cited

U.S. PATENT DOCUMENTS

| | | | |
|---|---|---|---|
| 3,381,283 | A | 4/1968 | Gyorgy et al. |
| 4,941,026 | A | 7/1990 | Temple |
| 5,236,711 | A | 8/1993 | Ostby et al. |
| 6,710,403 | B2 | 3/2004 | Sapp |
| 6,764,889 | B2 | 7/2004 | Baliga |
| 6,828,637 | B2 | 12/2004 | Kim et al. |
| 6,881,994 | B2 | 4/2005 | Lett et al. |
| 2005/0275018 | A1* | 12/2005 | Venkatesan et al. .......... 257/347 |
| 2006/0003525 | A1* | 1/2006 | Noble et al. .................. 438/243 |
| 2006/0132035 | A1 | 6/2006 | Sawai et al. |

FOREIGN PATENT DOCUMENTS

| | | | |
|---|---|---|---|
| DE | 10007415 | * | 2/2000 |
| DE | 10007415 | | 1/2002 |

OTHER PUBLICATIONS

Final Office Action mailed Jun. 16, 2011 in U.S. Appl. No. 12/143,450.
Final Office Action mailed Sep. 8, 2011 in U.S. Appl. No. 12/143,450.
Office Action mailed Nov. 30, 2009 in U.S. Appl. No. 12/143,450.

* cited by examiner

*Primary Examiner* — Timor Karimy
(74) *Attorney, Agent, or Firm* — Dicke, Billig & Czaja, PLLC

(57) ABSTRACT

A semiconductor device with a field electrode and method. One embodiment provides a controllable semiconductor device including a control electrode for controlling the semiconductor device and a field electrode. The field electrode includes a number of longish segments which extend in a first lateral direction and which run substantially parallel to one another. The control electrode includes a number of longish segments extending in a second lateral direction and running substantially parallel to one another, wherein the first lateral direction is different from the second lateral direction.

9 Claims, 5 Drawing Sheets

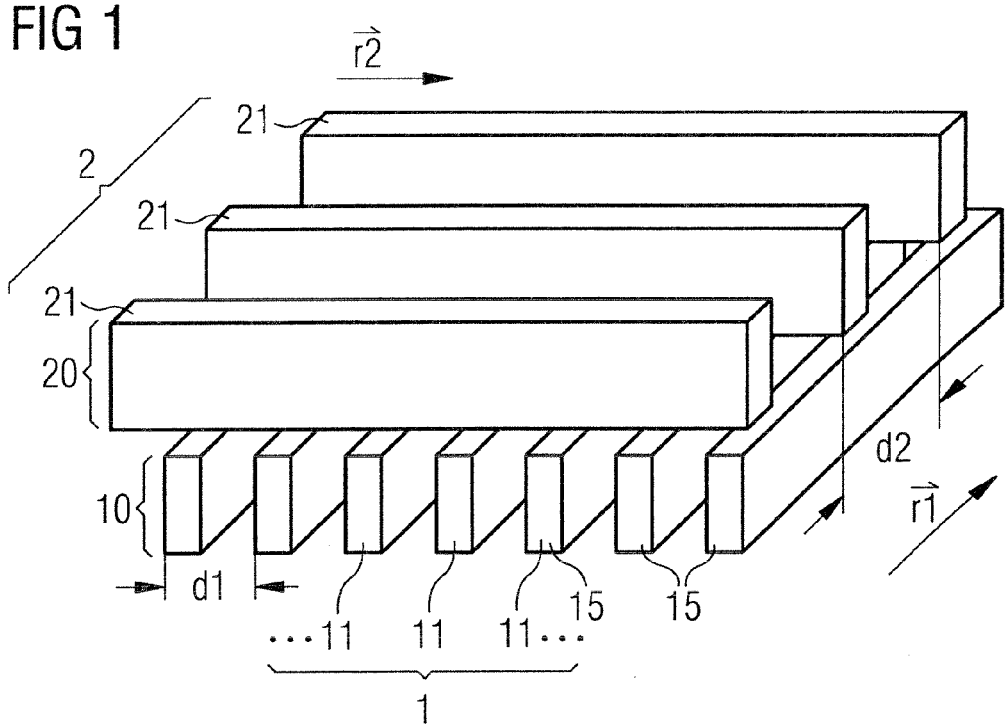
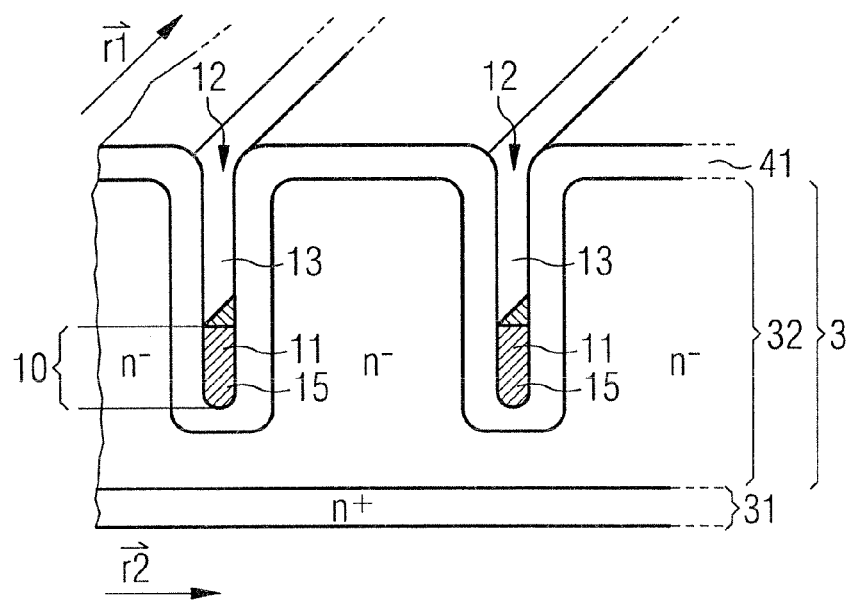

SEMICONDUCTOR DEVICE WITH FIELD ELECTRODE AND METHOD

CROSS-REFERENCE TO RELATED APPLICATIONS

This Utility Patent Application is a Divisional application of U.S. Ser. No. 12/143,450, filed Jun. 20, 2008, which is incorporated herein by reference.

BACKGROUND

The invention relates to controllable semiconductor devices including a cell structure and field electrodes, and to a method for forming controllable semiconductor devices including a cell structure and field electrodes.

In conventional semiconductor devices the arrangement of the field electrodes and of the gate electrodes follows the cell pitch of the cell structure. If such a conventional controllable semiconductor device is designed to have a low product of the on-resistance and the output capacitance, it is advantageous to minimize the channel resistance which can be achieved by a low cell pitch and, accordingly, a high density of the gate electrodes. Coming along therewith, also the density of the field electrodes is increased, which causes an increased output capacitance.

Hence, there is a need for an improved controllable semiconductor device and for a method for producing an improved controllable semiconductor device.

SUMMARY

A controllable semiconductor device with a cell structure is provided. The controllable semiconductor device includes a semiconductor body, a control electrode for controlling the semiconductor device, and a field electrode. The control electrode includes a number of longish segments which extend in a first lateral direction and which run substantially parallel to one another. The field electrode includes a number of longish segments which extend in a second lateral direction and which run substantially parallel to one another.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 1 is a perspective schematic view illustrating one embodiment of the relative arrangement of a control electrode and a field electrode of a controllable semiconductor device in which substantially parallel longish segments of the control electrode and substantially parallel longish segments of the field electrode extend in orthogonal directions.

FIGS. 2 to 8 are perspective views illustrating production of a controllable semiconductor device at different stages.

DETAILED DESCRIPTION

Figure 3:
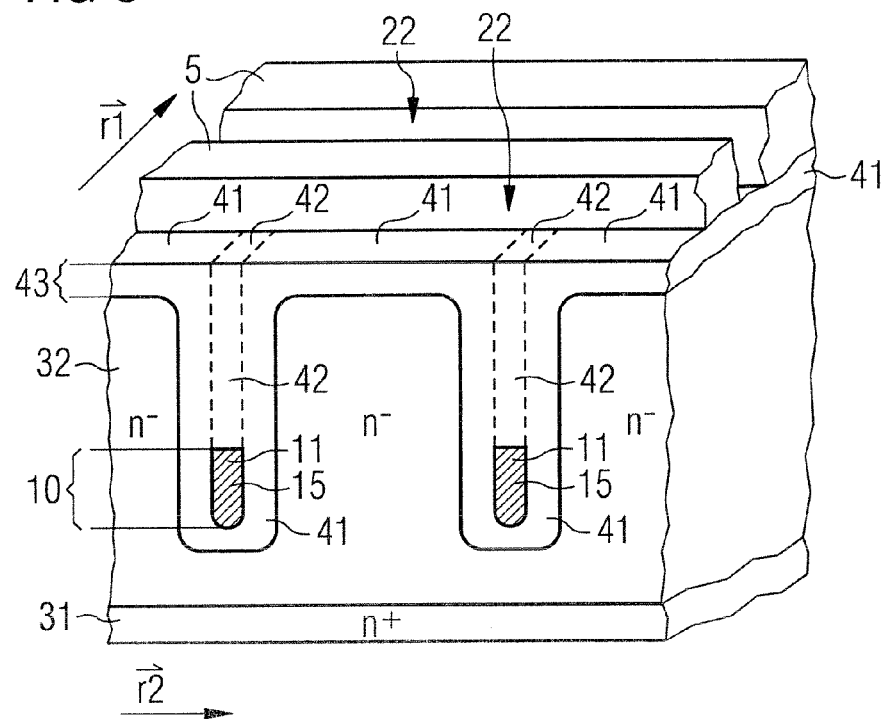

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

In the sense of the present invention, "substantially parallel" means that the longish segments ideally run parallel to one another. However, the scope of the present invention also includes minor deviations, e.g., conditional on manufacturing, from the parallel state. "Extend" is used in the sense that a longish segment extends in its longitudinal direction. The first lateral direction is different from the second lateral direction, i.e. the first lateral direction and the second lateral direction run non-parallel to one another. In such a structure, the pitch of the longish segments of the control electrodes and the pitch of the longish segments of the field electrodes may be adapted independently from one another.

It is to be understood that the features of the various exemplary embodiments described herein may be combined with each other, unless specifically noted otherwise.

FIG. 1 illustrates a field electrode 1 and a control electrode 2 of a controllable semiconductor device. For the sake of clarity, all other parts of the controllable semiconductor device are not depicted. The field electrode 1 includes a number of first longish segments 11 which run substantially parallel to one another and which extend in a first lateral direction r1. Accordingly, the control electrode 2 includes a number of second longish segments 21 which run substantially parallel to one another and which extend in a second lateral direction r2, wherein the second lateral direction r2 runs perpendicular to the first lateral direction r1. This orthogonal structure is chosen for easier visualization.

Except from 0° and 180°, angles different from 90° between the lateral directions r1 and r2 are also possible. In certain embodiments it might be attractive e.g., to choose the first lateral direction r1 identical with the (110) direction of the crystalline structure of the semiconductor body, and the second lateral direction r1 identical with the (100) direction of the crystalline structure of the semiconductor body, or, vice versa, to choose the first lateral direction r1 identical with the (100) direction of the crystalline structure of the semiconductor body, and the second lateral direction r1 identical with the (110) direction of the crystalline structure of the semiconductor body, or, vice versa.

In the example of FIG. 1, the substantially parallel longish segments 11 of the field electrode 1 are arranged in a first layer 10 and the substantially parallel longish segments 21 of the control electrode 2 are arranged in a second layer 20, wherein the second layer is located above and distant from the first layer 10.

The controllable semiconductor device includes a—not illustrated—cell structure with a number of cells, e.g., transistor cells, which are arranged successively in the first lateral direction r1. To each cell of the cell structure one or more longish segments 21 of the control electrode 2 may be assigned. Such a cell structure may include a number of adjacent and optionally identical cells with identical widths so that a cell pitch, i.e. the distance between identical structures of adjacent cells, may be defined. In FIG. 1, the longish segments 21 are identical structures having a cell pitch d2.

The longish segments 11 may also include a pitch d1. However, the pitch d1 of the longish segments 11 is not enforced by the cell structure and therefore may be different from the pitch d2 or different from an integer multiple of the pitch d2.

The complete device may, for instance, be a MOSFET, an IGBT or a MOS-controlled diode. The control electrode may, e.g., be a gate electrode.

FIGS. 2 to 8 illustrate perspective views of one embodiment of a controllable semiconductor device including a structure as explained on the basis of FIG. 1 at different processes during its production. By way of example, the semiconductor device produced in the example of FIGS. 2 to 8 is an n-channel field-effect transistor. In this transistor, the control electrode is the gate electrode. However, the embodiment also covers any other semiconductor device including a cell structure with control electrodes and field electrodes, in one embodiment, p-channel field-effect transistors.

A semiconductor body 3, e.g., of silicon or of silicon carbide, is provided. The semiconductor body may include a highly n-doped substrate 31 on which a weakly n-doped layer 32 is arranged. For instance, the weakly n-doped layer 32 may be produced by epitaxial growth.

After applying and patterning a mask on the semiconductor body 3, first trenches 12 forming a first trench system are etched into the semiconductor body 3 by use of the patterned mask. Then, the mask is removed. Optionally, the first trenches 12 may be rounded by e.g., an isotropic silicon etch or a sacrificial thermal oxidation that is removed afterwards. Then, on the surface of the first trenches 12 and, optionally, on the upper surface of the semiconductor body 3, a first dielectric layer 41 is produced. The first dielectric layer 41 may be, e.g., a field oxide layer.

After producing the first dielectric layer 41, the first trenches 12 are filled at least partially with a first electrically conductive material 15, e.g., a metal or a polycrystalline semiconductor material as, for instance, polycrystalline silicon or polycrystalline silicon carbide, to form the longish segments 11 of the field electrode 1. Optionally, the first trenches 12 may be filled completely such that also the upper side of the semiconductor body 3 between adjacent first trenches 12 is covered with the first electrically conductive material 15. In a further process, the first electrically conductive material 15 is etched back below the upper edges of the first trenches 12 such that the first trenches 12 are only partially filled with the electrically conductive material 15, and that an unfilled area 13 of the first trench system remains above the first electrically conductive material 15. This etch back might be masked partially in certain areas of the cell field to allow an easier contact to the first electrode. In one embodiment, the first electrically conductive material may be removed from the upper side of the semiconductor body 3 prior to the masked etch back by a planarizing process. For example, the process of planarizing may be realized by CMP (CMP=Chemical Mechanical Polishing).

The result of these processes can be seen in FIG. 2.

Then, the unfilled area 13 of the first trenches 12 above the first electrically conductive material 15 is filled with a dielectric material 42, e.g., with a silicon oxide. Optionally the dielectric material 42 may be removed from the top surface of the dielectric material 41, e.g., by a planarizing CMP process or by simple etch back. Thereby, the first trenches 12 may be filled completely such that the upper side of the semiconductor body 3 is covered completely with a dielectric layer 43.

Figure 4:
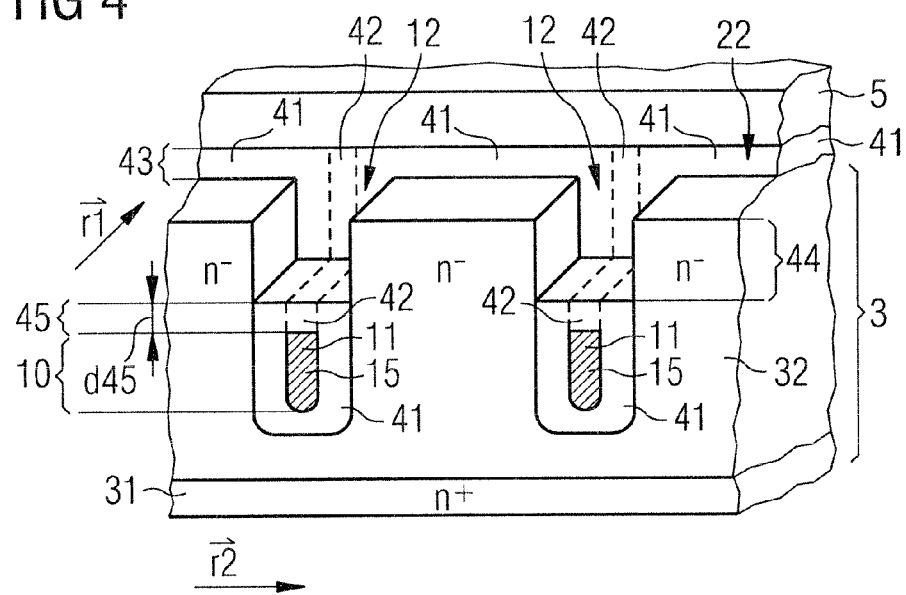

To form gate trenches, the dielectric layer 43 is lithographically structured by use of a structured resist mask 5 as illustrated in FIG. 3. The structured dielectric layer 43 includes substantially parallel longitudinal openings which extend in a second lateral direction r2 which runs perpendicular to the first lateral direction r1. Then, by use of the resist mask 5, an anisotropic etch is applied to the dielectric layer 43, including the dielectric material 41 and 42. This anisotropic etch may optionally be split in a first part with a detectable end point signal when reaching the surface of the semiconductor body 3 and a second part lasting a pre-defined period of time. By this etch the dielectric material 41, 42 which is arranged in the first trenches 12 is removed in layer 44 above the top side of the first longish segments 10 such that a layer 45 of the dielectric material 41, 42 remains above the first longish segments 11. The thickness d45 is specified to assure a sufficient insulation of the first longish segments 11 against the second longish segments to be arranged above and crossing the first longish segments 10. The result is illustrated in FIG. 4.

Figure 5:
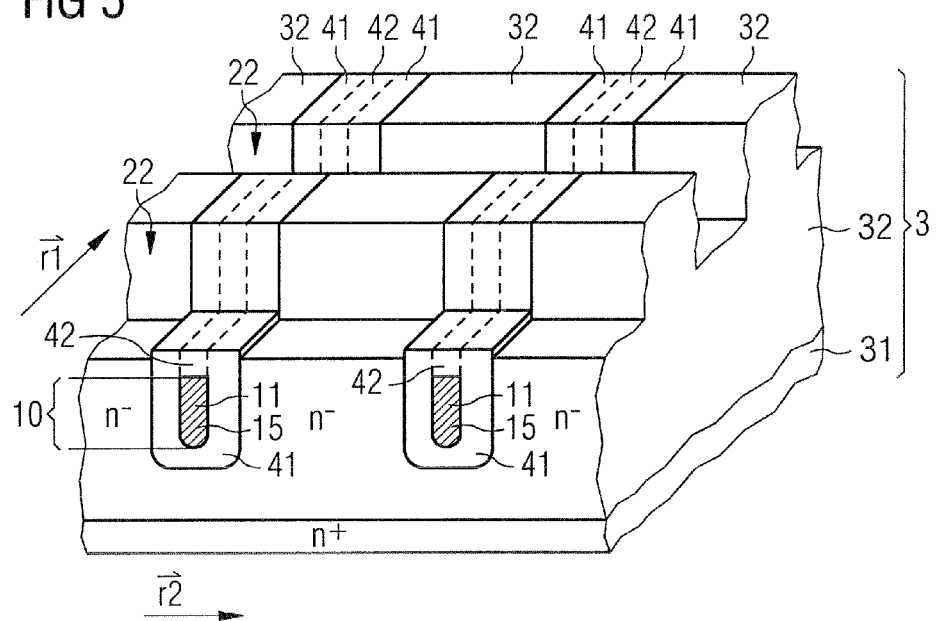
Figure 6:
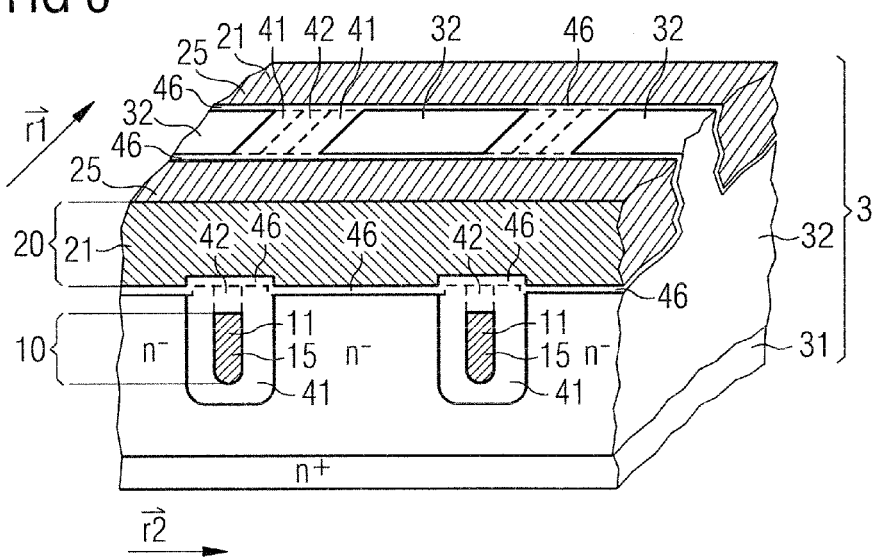

After removing the resist 5, the remaining semiconductor body is removed in the layer 44 by an anisotropic etch that is selective to the dielectric materials 41 and 42. The depth of this etch is targeted to reach the same depth 44 as the preceding etch of the dielectric layer including the dielectric materials 41 and 42. Due to process tolerances the reached depth may be more shallow or also deeper (as illustrated e.g., in FIG. 5). Then, for instance in a CMP-process, the hard mask formed by the layer 43 is removed. The result is a number of second trenches 22 extending in the second direction r2 as illustrated in FIG. 5.

After an optional process of rounding the second trenches 22, e.g., by a sacrificial oxidation with subsequent oxide removal, a further dielectric layer 46 is created on the surface of the semiconductor body 3, here on the surface of the weakly n-doped layer 32, at least at the side walls and the bottoms of the second trenches 22. The dielectric layer 46 serves as gate dielectric and insulates the longish segments 21 of the control electrode 2 to be produced against the weakly n-doped layer 32. For instance, the dielectric layer 46 may be formed by oxidizing the semiconductor material of the semiconductor body 3.

Then, the second trenches 22 are filled at least partially with a second electrically conductive material 25, e.g., polycrystalline semiconductor material as, for instance, polycrystalline silicon or polycrystalline silicon carbide, to form the longish segments 21 of the control electrode 2.

Optionally, the second trenches 22 may be filled completely with the second conductive material 25 such that also the upper side of the semiconductor body 3 between adjacent second trenches 22 is covered with the second electrically conductive material 25. Then, the second electrically conductive material 25 and the semiconductor body 3, here the semiconductor layer 32, are planarized, e.g., by etch-back or by a CMP process, to form a flat surface with the top surfaces of the second electrically conductive material 25 and of the semiconductor body 3 flushing. In one embodiment, the etch-back may also be carried out masked leaving the electrically conductive material 25 on certain areas of the surface of the semiconductor body 3.

Figure 7:
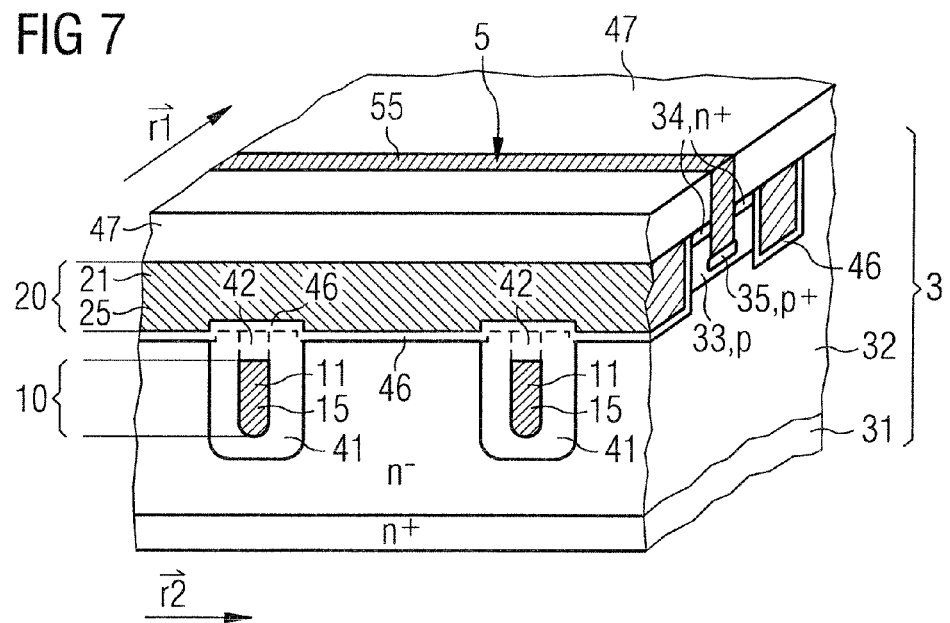

Then, optionally a thin layer of dielectric material is deposited e.g., by a short thermal oxidation process to prevent out-diffusion of dopants from the electrically conductive material 25. In order to form a p-doped body zone 33, dopants are implanted through the top surface of the semiconductor body 3. Then, a body-drive process follows. In a further process a highly n-doped source zone 34 is formed by implanting dopants through the top surface of the semiconductor body 3, and by a following source-drive process. After depositing a further dielectric layer 47, e.g., an interlayer oxide, third trenches 5 are etched masked by a patterned resist layer (not illustrated in the figures). After implanting dopants to form a highly p-doped body contact zone 35, a contact fill is filled in the contact holes and in the trenches 5. The contact fill may be an electrically conductive material 55, e.g., a metal or carbon or polycrystalline semiconductor material as, for instance, polycrystalline silicon or polycrystalline silicon carbide, or a contact and barrier metal like Ti/TiN or TiW followed by tungsten. The result is illustrated in FIG. 7.

Figure 8:
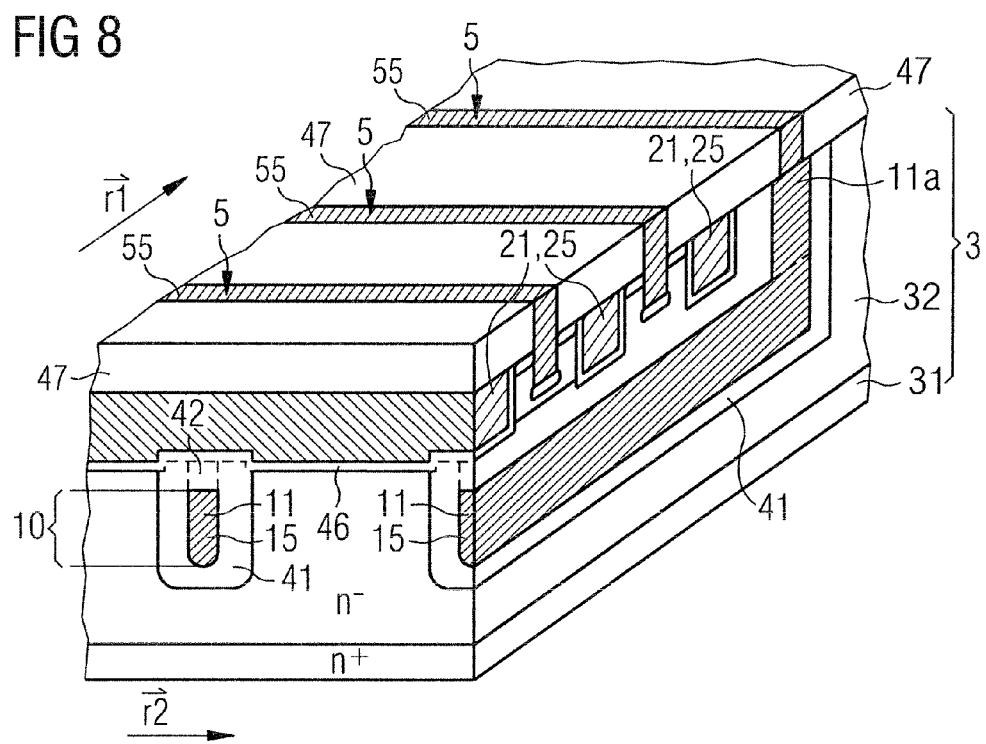

As can be seen from FIG. 8, at the rear end of the longish segments 11 of the field electrode a contact zone 11a including conductive material, e.g., polycrystalline semiconductor material, is provided in order to enable the field electrode to be electrically contacted from the top side of the device. The second electrode, the gate, is contacted in the same way (not illustrated in the figures). Then—also not illustrated—a power metal layer is deposited on the top side of the arrangement illustrated in FIG. 8 to make contact with the conductive material 55. In the example illustrated in FIGS. 2 to 8, this power metal layer is a source contact.

Figure 9:
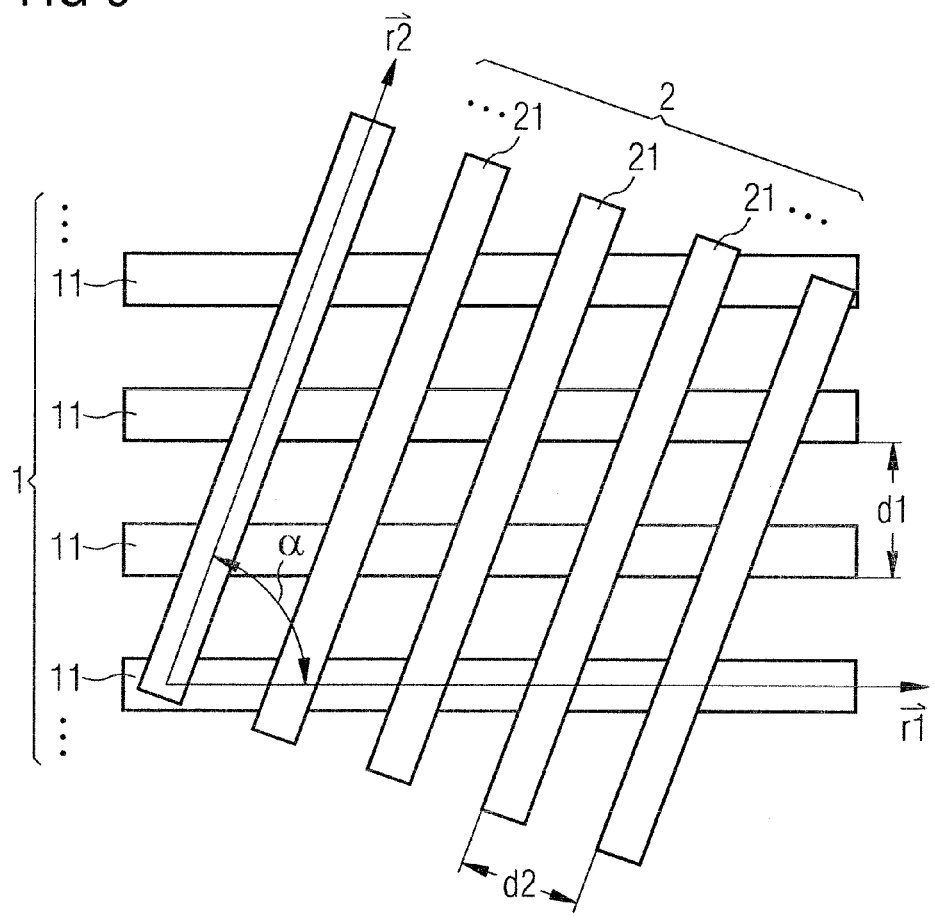
FIG. 9 is a schematic top view illustrating one embodiment of the relative arrangement of a control electrode and a field electrode of a controllable semiconductor device in which substantially parallel longish segments of the control electrode and substantially parallel longish segments of the field electrode include an angle which is different from 0°, 90° and 180°.

FIG. 9 is a schematic top view illustrating a further possible embodiment of the relative arrangement of the control electrode 1 and the field electrode 2 of a controllable semiconductor. As already described above, the substantially parallel longish segments 11 of the control electrode 1 extend in a first lateral direction r1. Accordingly, the substantially parallel longish segments 21 of the field electrode 2 extend in a second lateral direction r2. The first lateral direction r1 and the second lateral direction r2 include an angle α which is different from 0°, 90° and 180°. In general, the angle α may range from greater 0° to less than or equal to 90°, or from 60° to less than or equal to 90°. In other embodiments, the angle α may be 45°. In the embodiment illustrated in FIG. 1, the angle α is 90°. Just as in FIG. 1, in FIG. 9, only the control electrode 1 and the field electrode 2 of the controllable semiconductor device are illustrated. However, the complete device may also include the features described with reference to the previous figures.

Although various examples to realize the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. Such modifications to the inventive concept are intended to be covered by the appended claims.

Unless the features of the appended claims do not exclude each other, these features may be combined in an arbitrary manner.

What is claimed is:

1. A method for producing a semiconductor device comprising:
   providing a semiconductor body;
   forming a first trench system comprising a plurality of parallel segments longitudinally extending in a first lateral direction;
   filling the first trench system at least partially with a first conductive material to form longish segments which are permanently electrically connected to one another and form a single field electrode;
   forming a second trench system comprising a plurality of parallel segments longitudinally extending in a second lateral direction, wherein the second lateral direction is non-parallel to the first lateral direction; and
   filling the second trench system at least partially with a second conductive material to form longish segments which are permanently electrically connected to one another and form a single control electrode.

2. A method for producing a controllable semiconductor device comprising:
   providing a semiconductor body;
   forming a first trench system comprising a plurality of longish segments each of which extends in a first lateral direction and run substantially parallel to one another;
   filling the first trench system at least partially with a first conductive material to form a first plurality of longish segments which are permanently electrically connected to one another and form a single field electrode;
   forming a second trench system comprising a plurality of longish segments each of which extend in a second lateral direction and run substantially parallel to one another, wherein the second lateral direction runs non-parallel to the first lateral direction; and
   filling the second trench system at least partially with a second conductive material to form a second plurality longish segments which are permanently electrically connected to one another to form a single control electrode.

3. The method of claim 2, comprising:
   forming, prior to filling the first trench system at least partially with the first conductive material, a first dielectric layer on the surface of the first trench system; and
   etching back or planarizing the first conductive material, after filling the first trench system at least partially with the first conductive material, such that in the first trench system an unfilled area of the first trench system remains above the first conductive material.

4. The method of claim 3, comprising filling the unfilled area of the first trench system, prior to forming the second trench system, at least partially with dielectric material.

5. The method of claim 2, comprising wherein the first lateral direction and the second lateral direction include an angle ranging from 60° to 90°.

6. The method of claim 2, comprising wherein the first lateral direction and the second lateral direction include an angle of 45°.

7. The method of claim 2, the semiconductor body comprises a crystal structure with a (100) direction and with a (110) direction, wherein the first lateral direction is identical with the (100) direction, and the second lateral direction is identical with the (110) direction.

8. The method of claim 2, the semiconductor body comprises a crystal structure with a (100) direction and with a (110) direction, wherein the first lateral direction is identical with the (110) direction, and the second lateral direction is identical with the (100) direction.

9. The method of claim 2, wherein the first trench system is formed in a continuous drift zone.

* * * * *